United States Patent [19]
Heremans et al.

[11] Patent Number: 5,232,862
[45] Date of Patent: * Aug. 3, 1993

[54] METHOD OF FABRICATING A TRANSISTOR HAVING A CUBIC BORON NITRIDE LAYER

[75] Inventors: Joseph P. Heremans, Troy; Gary L. Doll, Utica; Jeffrey A. Sell, W. Bloomfield, all of Mich.

[73] Assignee: General Motors Corporation, Detroit, Mich.

[*] Notice: The portion of the term of this patent subsequent to Jan. 14, 2009 has been disclaimed.

[21] Appl. No.: 819,727

[22] Filed: Jan. 13, 1992

Related U.S. Application Data

[62] Division of Ser. No. 552,978, Jul. 16, 1990, Pat. No. 5,142,350.

[51] Int. Cl.[5] .......................................... H01L 21/336
[52] U.S. Cl. ........................................ 437/40; 437/21; 437/41
[58] Field of Search ............... 437/40, 41, 21, 100

[56] References Cited

U.S. PATENT DOCUMENTS

| | | | |
|---|---|---|---|
| 3,877,060 | 4/1975 | Shono et al. | 357/61 |
| 4,118,539 | 10/1978 | Hirai et al. | 156/614 |
| 4,177,474 | 12/1979 | Ovshinsky | 357/61 |
| 4,297,387 | 10/1981 | Beale | 427/42 |
| 4,565,741 | 1/1986 | Morimoto et al. | 428/427 |
| 4,714,625 | 12/1987 | Chopra et al. | 427/47 |
| 4,772,927 | 9/1988 | Saito et al. | 357/23.7 |
| 4,809,056 | 2/1989 | Shirato et al. | 357/23.7 |
| 4,832,986 | 5/1989 | Gladfelter et al. | 427/255 |
| 4,843,031 | 6/1989 | Ban et al. | 437/935 |
| 4,906,587 | 3/1990 | Blake | 357/23.7 |
| 4,914,491 | 4/1990 | Vu | 357/23.7 |
| 4,950,618 | 8/1990 | Sundaresan et al. | 357/23.7 |
| 4,957,773 | 9/1990 | Spencer et al. | 427/255.2 |
| 4,973,494 | 11/1990 | Yamazaki | 427/255.2 |
| 4,980,730 | 12/1990 | Mishima et al. | 357/61 |
| 5,081,053 | 1/1992 | Heremans et al. | 437/21 |
| 5,107,315 | 4/1992 | Kumagai et al. | 437/100 |

FOREIGN PATENT DOCUMENTS

| | | | |
|---|---|---|---|
| 57-122515 | 7/1982 | Japan | 357/61 |
| 59-114853 | 7/1984 | Japan | 357/61 |
| 61-84379 | 4/1986 | Japan | 427/53.1 |
| 61-149477 | 7/1986 | Japan | 357/61 |
| 61-222111 | 10/1986 | Japan | 357/61 |
| 62-77454 | 4/1987 | Japan | . |
| 243770 | 10/1987 | Japan | . |
| 63-120429 | 6/1988 | Japan | 357/61 |
| 63-129631 | 6/1988 | Japan | 357/61 |

OTHER PUBLICATIONS

"Laser Pulse Vapour Deposition of Polycrystalline Wurtzite-type BN", Thin Solid Films, 147 (1987) L45-L50.

(List continued on next page.)

*Primary Examiner*—Mary Wilczewski
*Attorney, Agent, or Firm*—Cary W. Brooks

[57] ABSTRACT

A multilayer structure for use in forming a transistor which may be suitable for high temperature applications is provided. A single crystal silicon substrate has an overlaying layer of epitaxially grown cubic boron nitride in crystallographic registry with the silicon substrate. The cubic boron nitride is epitaxially grown using laser ablation techniques and provides an electrically resistive and thermally conductive barrier. An active layer of epitaxial silicon is then grown from the layer of cubic boron nitride, such that the overlaying layer of epitaxial silicon is in crystallographic registry with the layer of boron nitride which is in crystallographic registry with the underlying silicon substrate. Appropriately doped source and drain regions and a gate electrode are provided to form the transistor. A clean crystallographic lattice match between the cubic boron nitride and surrounding silicon is obtained, thereby minimizing any stresses due to a mismatch in lattice constants and permitting the overlaying silicon active layer to be extremely thin.

3 Claims, 1 Drawing Sheet

OTHER PUBLICATIONS

"Growth of Stoichiometric BN Films by Pulsed Laser Evaporation", Mat. Res. Soc. Symp. Proc., vol. 128 (1989) pp. 469-474.

Chemical Abstract 110(22): 197972n, "Formation of Cubic Boron Nitride (CBN) Films by an Ion-Plating Method", Ikeda et al., R&D, Res. Dev. (Kobe Steel Ltd.), 1989.

Rother et al, "Preparation & Characterization of Ion Plated Boron Nitride", Thin Solid Films, vol. 142, pp. 83-99 (1986).

Weismantel et al, "Preparation and Properties of Hard i-C and i-BN Coatings", Thin Solid Films, vol. 98, pp. 31-44 (1982).

Doll et al, "Laser Deposited Cubic Boron Nitride Films", MRS Spring Meeting, Apr. 1990, San Francisco, Calif.

Doll et al, "Laser Deposited Cubic Boron Nitride Films on Silicon", 2nd Int. Conf. in The New Diamond Sci. & Tech. Sep. 23-27, 1990, Wash. D.C.

Doll et al, "The Growth & Characterization of Epitaxial Cubic Boron Nitride Films on Silicon", submitted to Phy. Rev. Lett. Oct. 25, 1990.

Electronics Letters, vol. 25, No. 23, 9th Nov. 1989, pp. 1602-1603; T. K. Paul et al.: "Laser-assisted deposition of BN films on InP for MIS applications".

Thin Solid Films, vol. 153, No. 1, Oct. 26th 1987, pp. 487-496; P. Lin et al.: "Preparation and properties of cubic boron nitride coatings" (Abstract).

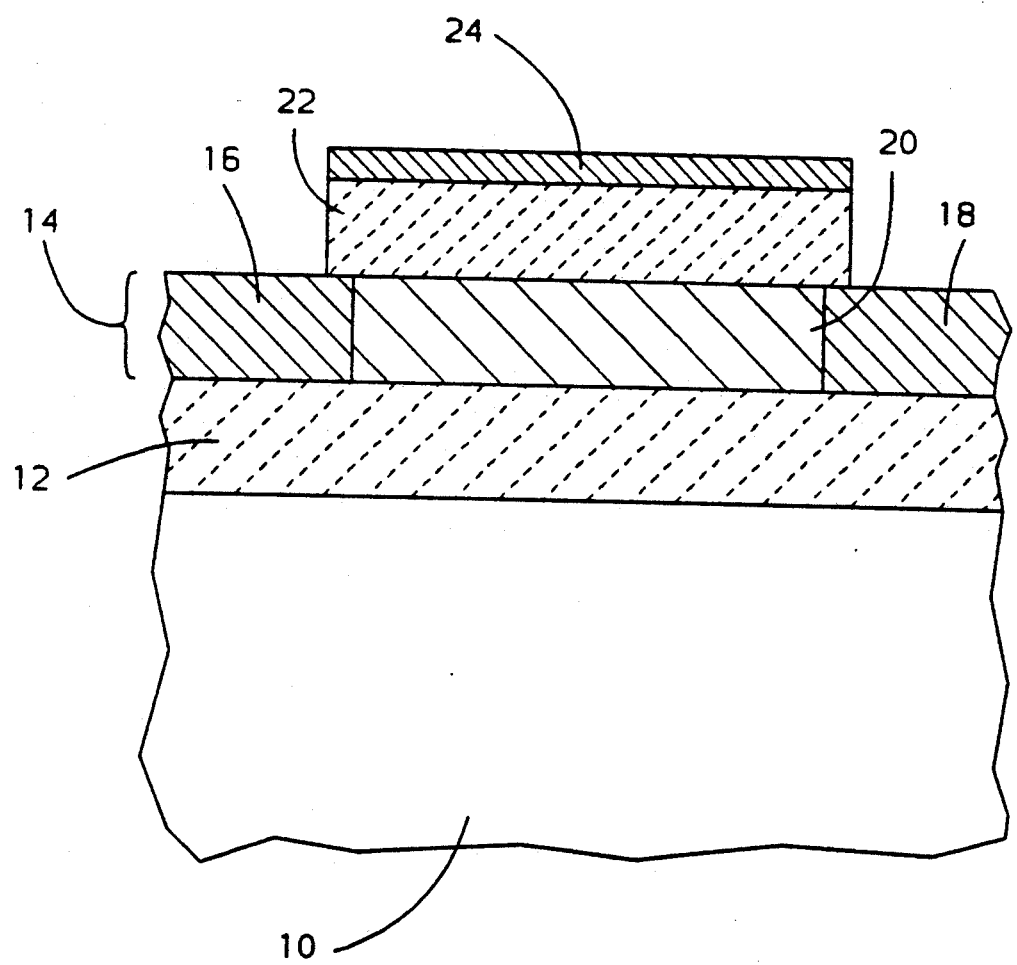

METHOD OF FABRICATING A TRANSISTOR HAVING A CUBIC BORON NITRIDE LAYER

This is a division of application Ser. No. 07/552,978 filed on Jul. 16, 1990, now U.S. Pat. No. 5,142,350.

This invention generally relates to transistors for microelectronic applications. More particularly, this invention relates to a transistor having a silicon active layer overlaying a cubic boron nitride layer which is in epitaxial registry with an underlying single crystal, silicon substrate, and which may be suitable for high temperature applications.

BACKGROUND OF THE INVENTION

Boron nitride (BN) is a most interesting III-IV compound from both the practical and scientific viewpoints. Boron nitride is characterized by three different crystal structures: hexagonal, wurtzite and cubic zincblende. The boron nitride phase having the cubic zincblende crystal structure is particularly useful since it is characterized by many desirable physical properties including high electrical resistivity and high thermal conductivity. In addition, the cubic zincblende boron nitride is relatively inert chemically. Because of these properties, this cubic form of the boron nitride is potentially very useful for electronic devices, particularly at high temperatures.

A cubic form of boron nitride has been grown on silicon wafers by means of a laser ablation technique, as disclosed in U.S. patent application Ser. No. 07/446,758 to Gary L. Doll et al, entitled "Laser Deposition of Crystalline Boron Nitride Films", filed on Dec. 6, 1989, and assigned to the same assignee of this patent application, now abandoned. With this laser ablation method, single crystal cubic boron nitride films were epitaxially grown on a silicon substrate oriented along the [100] axis, such that the resulting cubic boron nitride films were in epitaxial registry with the underlying silicon substrate.

As stated above, the cubic boron nitride has many characteristics useful for high temperature electronic applications However, it is necessary for the formation of electronic devices to have a silicon active layer. Therefore, it would be desirable to epitaxially grow a silicon layer over the cubic boron nitride which is in epitaxial registry with the underlying silicon substrate formed by the above laser ablation method. Such a silicon on boron nitride film would be a likely candidate for replacement of the silicon on sapphire systems which are currently in use for high temperature electronics.

The silicon on boron nitride system is advantageous in that the epitaxial interface between the overlaying silicon layer and boron nitride layer would be characterized by a clean lattice match between the two different materials' crystallographic structures, not like the mismatched lattices between the silicon and sapphire interface. This mismatch in lattice constants between the silicon and sapphire results in a drastic and non-reproducable shortening of the lifetime of the carrier in the silicon layer, thereby limiting the use of the silicon-on-sapphire transistors in high temperature devices.

It would therefore be desirable to provide a means for producing a device having an active silicon layer suitable for high temperature applications, such as an active silicon layer which is in epitaxial registry with an underlying cubic boron nitride film.

SUMMARY OF THE INVENTION

It is an object of the present invention to provide an epitaxial silicon layer which is in crystallographic registry with an underlying cubic boron nitride layer wherein the cubic boron nitride layer is in epitaxial registry with an underlying single crystal silicon substrate.

It is a further object of this invention that such an epitaxial silicon layer provide the active layer within an electronic transistor which may be suitable for use at high temperatures.

In accordance with a preferred embodiment of this invention, these and other objects and advantages are accomplished as follows.

A transistor may be formed from a multilayer structure of materials. First, an overlaying layer of cubic boron nitride is epitaxially grown on an underlying single crystal silicon substrate. The silicon substrate is crystallographically oriented along the [100] crystallographic plane. The overlaying boron nitride layer is in crystallographic registry with the silicon substrate, and is preferably formed using laser ablation techniques Next, a layer of silicon is epitaxially deposited onto the layer of cubic boron nitride so that it is in crystallographic registry with the underlying cubic boron nitride layer. This epitaxial silicon layer provides the active layer within the transistor and may be made extremely thin. Appropriately doped source and drain regions are formed within this silicon layer, and a gate electrode is appropriately formed on the silicon layer in spaced relationship to the source and drain regions.

An inventive feature is that the active layer of the transistor is provided by device quality epitaxial silicon which is grown from an underlying cubic boron nitride film. The crystallographic lattice constants between the epitaxial silicon and cubic boron nitride are matched, therefore alleviating any stress which may occur due to mismatched lattice constants and therefore permitting this active layer to be made extremely thin. The cubic boron nitride film is also in crystallographic registry with the underlying silicon substrate.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawing wherein:

FIG. 1 is a cross-sectional view of a transistor formed in accordance with this invention.

DESCRIPTION OF THE PREFERRED EMBODIMENTS

As shown cross-sectionally in FIG. 1, an electronic transistor may be formed with this method. A polished, n-type electrical conductivity, single crystal silicon substrate 10 crystallographically oriented essentially throughout along its [100] axis is provided. A layer of cubic boron nitride 12 is epitaxially grown on the silicon substrate 10 using laser ablation techniques. The cubic boron nitride film 12 is therefore in epitaxial registry with the underlying single crystal silicon substrate 10.

A preferred method for forming the cubic boron nitride film 12 utilizes laser ablation techniques described in the copending U.S. patent application, Ser.

No. 07/446,758, which is incorporated herein by reference. Generally, a boron nitride target containing polycrystalline, hexagonally oriented, pyrolitic boron nitride was provided on a rotating turntable and appropriately located in relationship to the single-crystal silicon substrate within a stainless steel 6-way cross chamber which was evacuated to an appropriately low pressure. The n-type single crystal silicon substrate 10 was heated to approximately 400° C. and maintained there during the ablation and deposition process. A KrF excimer laser source operating at an appropriate wavelength and frequency was used as the ablating beam. The laser operated in ultra-high purity nitrogen gas and laser fluencies ranging from about 1.5 to 5.2 $J/cm^2$. The energy emitted from the laser operating at these parameters was approximately 5 electron volts, which is approximately 20 percent higher than the disassociation energy of about 4 electron volts required for disassociation of the boron nitride target. The thickness of the cubic boron nitride thin films was determined to vary linearly with laser fluence and the number of laser pulses. At a laser fluence of approximately 3.9 $J/cm^2$, an average deposition rate of approximately 0.182 Angstroms per pulse was measured. For a 12,000 pulse run and a laser fluency of approximately 1.5 $J/cm^2$, a cubic boron nitride film 12 was produced having a thickness of approximately 176 nanometers, although any thickness within practical concerns could be formed for use in this transistor.

The cubic boron nitride layer 12 provides an insulating, thermally conductive barrier layer for the silicon-based microelectronic transistor shown in FIG. 1. The resulting boron nitride layer 12 was characterized by a cubic structure having an approximately 3.6. Angstrom lattice constant. The boron nitride layer has been observed to grow along two distinct silicon directions. The first orientation has the [001] cubic boron nitride axis parallel to the [001] silicon axis and the [100] cubic boron nitride axis parallel to the [110] silicon axis. In the second orientation, the crystallographic axes of the cubic boron nitride are all aligned with the silicon axes. In the first orientation, the boron nitride lattice must expand by about 5.7% to fit across the [110] diagonal of the silicon lattice. This large lattice mismatch should result in a high density of dislocations at the silicon-boron nitride interface leading to a lesser quality transistor device. In the second orientation, two silicon lattices each with a lattice constant of about 5.43 Angstroms accommodate three cubic boron nitride lattices with a lattice mismatch of less than 0.05%. In this configuration, either the boron or the nitrogen atoms will align themselves over the silicon atoms, resulting in a matched morphological interface between the silicon 10 or 14 and cubic boron nitride layer 12. The second orientation is extremely advantageous since the matched interface between the cubic boron nitride layer 12 and surrounding silicon 10 or 14 minimizes any stresses due to a mismatched lattice and results in a higher quality interface and corresponding higher quality transistor device. In addition, the cubic boron nitride layer 12 provides an electrically resistive and thermally conductive barrier.

A thin layer 14 of silicon preferably about 20 to 70 nanometer thick is grown on the epitaxial cubic boron nitride film 12. This layer 14 of silicon provides the active layer 14 of the transistor and is characterized by an areal carrier concentration of less than about $2 \times 10^{12}$ $cm^{-2}$. This active silicon layer 14 may be grown by conventional chemical vapor deposition or molecular beam epitaxy techniques, or possibly laser ablation techniques. Since this silicon layer 14 is being grown from the lattice matched boron nitride film 12 and therefore the stresses associated with a mismatch are minimized, it does not have to be unnecessarily thick to provide device quality epitaxial silicon as with previous material combinations.

A suitable metal dopant having three valence electrons, such as boron or gallium, is then conventionally diffused into the device through an appropriate mask so as to form the p-type source and drain regions, 16 and 18 respectively, within the n-type silicon active layer 14 of this p-n-p type transistor. An overlaying metal contact, preferably formed from aluminum or gold, would also be provided on the source and drain regions, 16 and 18.

The source and drain regions 16 and 18 are in a spaced relation such that a region 20 of the n-type silicon active layer 14 which is not doped is provided between the source and drain regions 16 and 18. An electrically insulating layer 22, such as silicon oxide or even cubic boron nitride, is then grown on that undoped region 20 of the silicon active layer 14 so as to contact the source and drain regions 16 and 18 using conventional technology. A metal pad 24 is then evaporated on that insulative layer 22 so as to provide an electrode 24, or gate, for the transistor. When an appropriate voltage bias greater than the threshold voltage bias is applied to the gate electrode 24, an electrical charge is induced between the source and drain regions 16 and 18. The insulative layer 22 is necessary to ensure that the electronic charge will move from the source to the drain region 16 and 18.

Since the active layer 14 of epitaxial silicon is so thin, the gate 24 voltage bias depletes the silicon throughout that layer 14. This substantially eliminates any thermally excited intrinsic carriers which practically make it impossible to switch the transistor off during high operating temperatures. In addition, the cubic boron nitride layer 12 provides an electrically resistive and thermally conductive barrier between the silicon substrate 10 and active silicon layer 14. Therefore, this device may be useful for high temperature applications. With this invention, an extremely thin layer 14 of the device quality, epitaxial silicon may be formed on the cubic boron nitride layer 12, which was not possible previously due to the stresses associated with the mismatch in crystallographic lattice constants.

While our invention has been described in terms of preferred embodiments, it is apparent that other forms of the device could be adopted by one skilled in the art, such as by substituting a p-type conductivity, crystallographically appropriately oriented, silicon substrate and modifying the processing parameters accordingly to form an n-p-n type transistor, and therefore such as further forming a CMOS device. Accordingly, the scope of our invention is to be limited only by the following claims.

The embodiments of the invention in which an exclusive property or privilege is claimed are defined as follows:

1. A method for forming a transistor suitable for use at high temperature comprising the following steps:
   providing a substrate of silicon oriented along a single crystallographic axis;
   depositing onto a surface of said substrate a thin film layer of cubic boron nitride, said thin film layer of cubic boron nitride being crystallographically aligned with said substrate;

depositing onto said thin film layer of cubic boron nitride a thin film layer of silicon, said thin film layer of silicon being crystallographically aligned with said thin film layer of boron nitride;

doping said thin film layer of silicon in at least two regions which are in a spaced relationship with each other to form a source region and a drain region which are separated by a region of undoped silicon; and depositing an electrical contact on said undoped region of said thin film layer of silicon so as to contact said source and drain regions.

2. A method for forming a transistor as recited in claim 1 wherein said silicon substrate is oriented essentially along the [100] crystallographic plane.

3. A method for forming a transistor suitable for use at high temperatures comprising the following steps:

providing a substrate of silicon oriented essentially along the '100' crystallographic axis;

laser ablating onto a surface of said substrate a thin film layer of cubic boron nitride, said thin film layer of boron nitride being crystallographically aligned with said substrate;

depositing onto said thin film layer of cubic boron nitride a thin film layer of silicon, said thin film layer of silicon being crystallographically aligned with said thin film layer of boron nitride;

doping said thin film layer of silicon in at least two regions which are in a spaced relationship with each other to form a source region and a drain region which are separated by a region of undoped silicon within said thin film layer of silicon; and depositing an electrical contact on said undoped region of said thin film layer of silicon so as to contact said source and drain regions.

* * * * *